(12) United States Patent
Bokma et al.

(10) Patent No.: US 9,293,278 B2
(45) Date of Patent: Mar. 22, 2016

(54) TWO PART KEY CAP FOR USE IN KEYBOARD KEYS AND METHODS FOR THEIR MANUFACTURE

(71) Applicant: Synaptics Incorporated, San Jose, CA (US)

(72) Inventors: Peter Bokma, Coeur d'Alene, ID (US); Raymond Chin, San Jose, CA (US); Robert J. Bolender, San Jose, CA (US); Kirsten Etzold, San Jose, CA (US)

(73) Assignee: Synaptics Incorporated, San Jose, CA (US)

( * ) Notice: Subject to any disclaimer, the term of this patent is extended or adjusted under 35 U.S.C. 154(b) by 53 days.

(21) Appl. No.: 14/149,089

(22) Filed: Jan. 7, 2014

(65) Prior Publication Data

US 2015/0194277 A1    Jul. 9, 2015

(51) Int. Cl.
| | |
|---|---|
| H01H 9/26 | (2006.01) |
| H01H 13/72 | (2006.01) |
| H01H 13/85 | (2006.01) |
| H03K 17/96 | (2006.01) |
| H03K 17/975 | (2006.01) |
| H01H 13/02 | (2006.01) |
| H01H 3/12 | (2006.01) |

(52) U.S. Cl.
CPC ........... *H01H 13/85* (2013.01); *H03K 17/9622* (2013.01); *H03K 17/975* (2013.01); *H01H 3/122* (2013.01); *H01H 13/023* (2013.01); *H01H 2215/028* (2013.01); *H01H 2221/026* (2013.01); *H01H 2221/04* (2013.01); *H01H 2239/006* (2013.01); *H03K 2217/96054* (2013.01); *H03K 2217/960775* (2013.01); *Y10T 29/49105* (2015.01)

(58) Field of Classification Search
CPC ... H03K 17/96; H03K 17/962; H03K 17/975; H01H 13/85; H01H 2239/006; H01H 2227/034; H01H 2221/058; H01H 2221/04
USPC ........................... 200/341, 344, 345; 341/27; 345/168–170, 172
See application file for complete search history.

(56) References Cited

U.S. PATENT DOCUMENTS

| | | | | |
|---|---|---|---|---|
| 3,760,243 | A * | 9/1973 | Peroutky | 200/600 |
| 6,392,515 | B1 * | 5/2002 | Van Zeeland et al. | 335/205 |
| 8,309,870 | B2 * | 11/2012 | Peterson et al. | 200/344 |
| 8,604,370 | B2 * | 12/2013 | Chao | 200/314 |
| 8,847,890 | B2 * | 9/2014 | Peterson et al. | 345/168 |
| 8,912,458 | B2 * | 12/2014 | Peterson et al. | 200/344 |
| 2007/0199804 | A1 * | 8/2007 | Joseph et al. | 200/5 A |
| 2009/0178913 | A1 * | 7/2009 | Peterson et al. | 200/5 A |
| 2012/0299832 | A1 * | 11/2012 | Peterson et al. | 345/168 |

* cited by examiner

Primary Examiner — Kyung Lee
(74) Attorney, Agent, or Firm — Osha Liang LLP

(57) ABSTRACT

A key assembly is for use in a keyboard of the type including a key guide having a planar translation effecting (PTE) feature. The key assembly includes a key base having a PTE mating feature configured to interact with the PTE feature during a key press, and a key cap configured to be attached to the key base. The key base is made of a first material and the key cap is made of a second material different from the first material. A conductive portion and/or a magnet may be wedged between or secured within the key base or the key cap.

18 Claims, 7 Drawing Sheets

TWO PART KEY CAP FOR USE IN KEYBOARD KEYS AND METHODS FOR THEIR MANUFACTURE

FIELD OF THE INVENTION

This invention generally relates to electronic devices.

BACKGROUND OF THE INVENTION

Pressable touchsurfaces (touch surfaces which can be pressed) are widely used in a variety of input devices, including as the surfaces of keys or buttons for keypads or keyboards, and as the surfaces of touch pads or touch screens. It is desirable to improve the usability of these input systems.

FIG. 2 shows a graph 200 of an example tactile response curve associated with the "snapover" haptic response found in many keys enabled with metal snap domes or rubber domes. Specifically, graph 200 relates force applied to the user by a touchsurface of the key and the amount of key displacement (movement relative to its unpressed position). The force applied to the user may be a total force or the portion of the total force along a particular direction such as the positive or negative press direction. Similarly, the amount of key displacement may be a total amount of key travel or the portion along a particular direction such as the positive or negative press direction.

The force curve 210 shows four key press states 212, 214, 216, 218 symbolized with depictions of four rubber domes at varying amounts of key displacement. The key is in the "unpressed" state 212 when no press force is applied to the key and the key is in the unpressed position (i.e., "ready" position). In response to press input, the key initially responds with some key displacement and increasing reaction force applied to the user. The reaction force increases with the amount of key displacement until it reaches a local maximum "peak force" $F_1$ in the "peak" state 214. In the peak state 214, the metal snap dome is about to snap or the rubber dome is about to collapse. The key is in the "contact" state 216 when the keycap, snap dome or rubber dome, or other key component moved with the keycap makes initial physical contact with the base of the key (or a component attached to the base) with the local minimum "contact force" $F_2$. The key is in the "bottom" state 218 when the key has travelled past the "contact" state and is mechanically bottoming out, such as by compressing the rubber dome in keys enabled by rubber domes.

A snapover response is defined by the shape of the reaction force curve—affected by variables such as the rate of change, where it peaks and troughs, and the associated magnitudes. The difference between the peak force $F_1$ and the contact force $F_2$ can be termed the "snap." The "snap ratio" can be determined as $(F_1-F_2)/F_1$ (or as $100*(F_1-F_2)/F_1$, if a percent-type measure is desired).

Presently known key assemblies for use in thin touch keyboards include a key cap and a key base made from a single piece of material. The key cap includes a top surface component upon which paint or ink is applied to define one or more alphanumeric characters. The key base includes a mating feature (such as a ramp) for sliding engagement with a stationary planar translation effecting (PTE) feature disposed on the keyboard floor. During manufacture, the mating feature is masked to avoid applying paint to the ramp. This process is both cumbersome and costly. Devices and methods are thus needed which overcome this limitation.

BRIEF SUMMARY OF THE INVENTION

Methods and apparatus are provided which overcome the foregoing limitation. In particular, a two-piece key assembly is provided which includes a key cap made from a first material and a key base made from a second material, thereby allowing the material properties of the respective pieces to be engineered separately. In an embodiment, the key base may be made from a material and/or surface finish exhibiting high lubricity to facilitate sliding engagement between the ramp and the planar translation effecting (PTE) feature. In contrast, the key cap may be made from a material and/or surface finish exhibiting a relatively lower lubricity to facilitate the application and long term usability of an opaque layer (e.g., paint) on a top surface of the key cap. Separately fabricating the key cap and the key base permits the two pieces to be connected together using a snap on, snap fit, interference fit, press fit, tongue-in-groove, detent, self snugging, or any other suitable mechanical connection or arrangement. Alternatively, the two pieces could be adhesively bonded together.

In various embodiments, the key assembly may include a magnet or ferromagnetic element configured to interact with a key guide magnet to return the key to a nominal position following a keystroke. In other embodiments, the key assembly may include a conductive portion configured to interact with a finger presence sensor disposed underneath the key cap. The two (or more) piece construction of the key cap and key base allows one or both of the magnet and conductive portion to be sandwiched, wedged, or otherwise contained or secured within either or both pieces. Alternatively, the conductive portion may be in the form of conductive paint applied to the key cap.

BRIEF DESCRIPTION OF DRAWINGS

Example embodiments of the present invention will hereinafter be described in conjunction with the appended drawings which are not to scale unless otherwise noted, where like designations denote like elements, and.

DETAILED DESCRIPTION OF THE INVENTION

The following detailed description is merely exemplary in nature and is not intended to limit the invention or the application and uses of the invention.

Various embodiments of the present invention provide input devices and methods that facilitate improved usability, thinner devices, easier assembly, lower cost, more flexible industrial design, or a combination thereof. These input devices and methods involve pressable touchsurfaces that may be incorporated in any number of devices. As some examples, pressable touchsurfaces may be implemented as surfaces of touchpads, touchscreens, keys, buttons, and the surfaces of any other appropriate input device. Thus, some non-limiting examples of devices that may incorporate pressable touchsurfaces include personal computers of all sizes and shapes, such as desktop computers, laptop computers, netbooks, ultrabooks, tablets, e-book readers, personal digital assistants (PDAs), and cellular phones including smart phones. Additional example devices include data input devices (including remote controls, integrated keyboards or keypads such as those within portable computers, or peripheral keyboards or keypads such as those found in tablet covers or stand-alone keyboards, control panels, and computer mice), and data output devices (including display screens and printers). Other examples include remote terminals, kiosks, point-of-sale devices, video game machines (e.g., video game consoles, portable gaming devices, and the like) and media devices (including recorders, editors, and players such as televisions, set-top boxes, music players, digital photo frames, and digital cameras).

The discussion herein focuses largely on rectangular touchsurfaces. However, the touchsurfaces for many embodiments can comprises other shapes. Example shapes include triangles, quadrilaterals, pentagons, polygons with other numbers of sides, shapes similar to polygons with rounded corners or nonlinear sides, shapes with curves, elongated or circular ellipses circles, combinations shapes with portions of any of the above shapes, non-planar shapes with concave or convex features, and any other appropriate shape.

In addition, although the discussion herein focuses largely on the touchsurfaces as being atop rigid bodies that undergo rigid body motion, some embodiments may comprise touchsurfaces atop pliant bodies that deform. "Rigid body motion" is used herein to indicate motion dominated by translation or rotation of the entire body, where the deformation of the body is negligible. Thus, the change in distance between any two given points of the touchsurface is much smaller than an associated amount of translation or rotation of the body.

Also, in various implementations, pressable touchsurfaces may comprise opaque portions that block light passage, translucent or transparent portions that allow light passage, or both.

Figure 1:
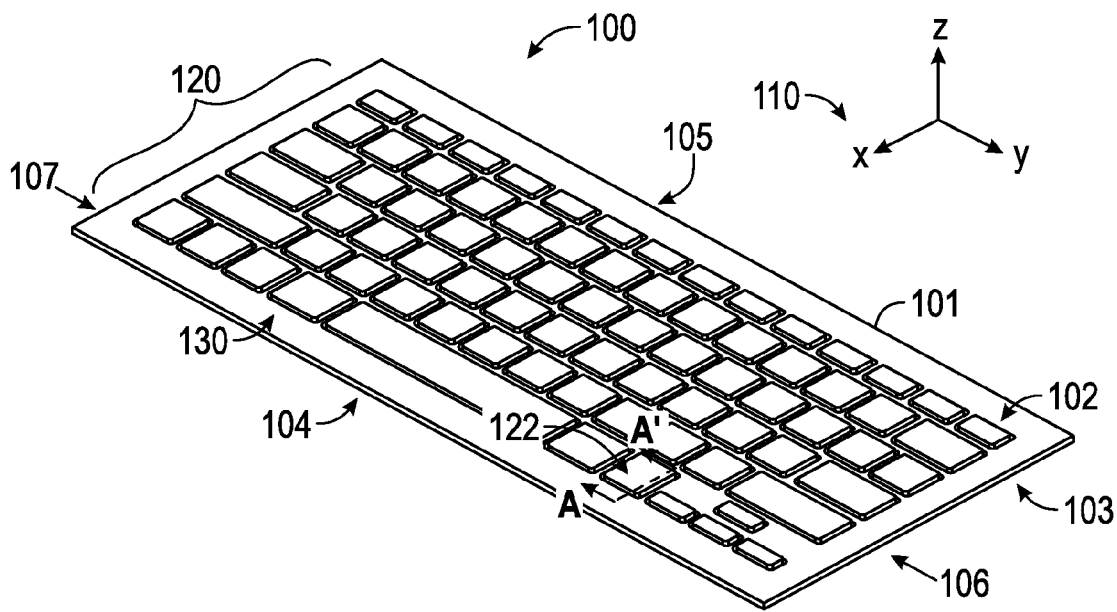
FIG. 1 shows an example keyboard that incorporates one or more implementations of key-based touchsurfaces configured in accordance with the techniques described herein.

FIG. 1 shows an example keyboard 100 that incorporates a plurality of (two or more) pressable key-based touchsurfaces configured in accordance with the techniques described herein. The example keyboard 100 comprises rows of keys 120 of varying sizes surrounded by a keyboard bezel 130. Keyboard 100 has a QWERTY layout, even though the keys 120 are not thus labeled in FIG. 1. Other keyboard embodiments may comprise different physical key shapes, key sizes, key locations or orientations, or different key layouts such as DVORAK layouts or layouts designed for use with special applications or non-English languages. In some embodiments, the keys 120 comprise keycaps that are rigid bodies, such as rigid rectangular bodies having greater width and breadth than depth (depth being in the Z direction as explained below). Also, other keyboard embodiments may comprise a single pressable key-based touchsurface configured in accordance with the techniques described herein, such that the other keys of these other keyboard embodiments are configured with other techniques.

Orientation terminology is introduced here in connection with FIG. 1, but is generally applicable to the other discussions herein and the other figures unless noted otherwise. This terminology introduction also includes directions associated with an arbitrary Cartesian coordinate system. The arrows 110 indicate the positive directions of the Cartesian coordinate system, but do not indicate an origin for the coordinate system. Definition of the origin will not be needed to appreciate the technology discussed herein.

The face of keyboard 100 including the exposed touchsurfaces configured to be pressed by users is referred to as the "top" 102 of the keyboard 100 herein. Using the Cartesian coordinate directions indicated by the arrows 110, the top 102 of the keyboard 100 is in the positive-Z direction relative to the bottom 103 of the keyboard 100. The part of the keyboard 100 that is typically closer to the body of a user when the keyboard 100 is in use atop a table top is referred to as the "front" 104 of the keyboard 100. In a QWERTY layout, the front 104 of the keyboard 100 is closer to the space bar and further from the alphanumeric keys. Using the Cartesian coordinate directions indicated by the arrows 110, the front 104 of the keyboard 100 is in the positive-X direction relative to the back 105 of the keyboard 100. In a typical use orientation where the top 102 of the keyboard 100 is facing upwards and the front 104 of the keyboard 100 is facing towards the user, the "right side" 106 of the keyboard 100 is to the right of a user. Using the Cartesian coordinate directions indicated by the arrows 110, the right side 106 of the keyboard 100 is in the positive-Y direction relative to the "left side" 107 of the keyboard 100. With the top 102, front 104, and right side 106 thus defined, the "bottom" 103, "back" 105, and "left side" 107 of the keyboard 100 are also defined.

Using this terminology, the press direction for the keyboard 100 is in the negative-Z direction, or vertically downwards toward the bottom of the keyboard 100. The X and Y directions are orthogonal to each other and to the press direction. Combinations of the X and Y directions can define an infinite number of additional lateral directions orthogonal to the press direction. Thus, example lateral directions include the X direction (positive and negative), the Y direction (positive and negative), and combination lateral directions with components in both the X and Y directions but not the Z direction. Motion components in any of these lateral directions is sometimes referred herein as "planar," since such lateral motion components can be considered to be in a plane orthogonal to the press direction.

Some or all of the keys of the keyboard 100 are configured to move between respective unpressed and pressed positions that are spaced in the press direction and in a lateral direction orthogonal to the press direction. That is, the touchsurfaces of these keys exhibit motion having components in the negative Z-direction and in a lateral direction. In the examples described herein, the lateral component is usually in the positive X-direction or in the negative X-direction for ease of understanding. However, in various embodiments, and with reorientation of select key elements as appropriate, the lateral separation between the unpressed and the pressed positions may be solely in the positive or negative X-direction, solely in the positive or negative Y-direction, or in a combination with components in both the X and Y directions.

Thus, these keys of the keyboard 100 can be described as exhibiting "diagonal" motion from the unpressed to the pressed position. This diagonal motion is a motion including both a "Z" (or vertical) translation component and a lateral (or planar) translation component. Since this planar translation occurs with the vertical travel of the touchsurface, it may be called "planar translational responsiveness to vertical travel" of the touchsurface, or "vertical-lateral travel."

Some embodiments of the keyboard 100 comprise keyboards with leveled keys that remain, when pressed during normal use, substantially level in orientation through their respective vertical-lateral travels. That is, the keycaps of these leveled keys (and thus the touchsurfaces of these keys) exhibit little or no rotation along any axes in response to presses that occur during normal use. Thus, there is little or no roll, pitch, and yaw of the keycap and the associated touchsurfaces remain relatively level and substantially in the same orientation during their motion from the unpressed position to the pressed position.

In various embodiments, the lateral motion associated with the vertical-lateral travel can improve the tactile feel of the key by increasing the total key travel for a given amount of vertical travel in the press direction. In various embodiments, the vertical-lateral travel also enhances tactile feel by imparting to users the perception that the touchsurface has travelled a larger vertical distance than actually travelled. For example, the lateral component of vertical-lateral travel may apply tangential friction forces to the skin of a finger pad in contact with the touchsurface, and cause deformation of the skin and finger pad that the user perceives as additional vertical travel. This then creates a tactile illusion of greater vertical travel. In some embodiments, returning the key from the pressed to the unpressed position on the return stroke also involves simulating greater vertical travel using lateral motion.

To enable the keys 120 of the keyboard 100 with vertical-lateral travel, the keys 120 are parts of key assemblies each comprising mechanisms for effecting planar translation, readying the key 120 by holding the associated keycap in the unpressed position, and returning the key 120 to the unpressed position. Some embodiments further comprise mechanisms for leveling keycaps. Some embodiments achieve these functions with a separate mechanism for each function, while some embodiments achieve two or more of these functions using a same mechanism. For example, a "biasing" mechanism may provide the readying function, the returning function, or both the readying and returning functions. Mechanisms which provide both readying and returning functions are referred to herein as "ready/return" mechanisms. As another example, a leveling/planar-translation-effecting mechanisms may level and effect planar translation. As further examples, other combinations of functions may be provided by a same mechanism.

The keyboard 100 may use any appropriate technology for detecting presses of the keys of the keyboard 100. For example, the keyboard 100 may employ a key switch matrix based on conventional resistive membrane switch technology. The key switch matrix may be located under the keys 120 and configured to generate a signal to indicate a key press when a key 120 is pressed. Alternatively, the example keyboard 100 may employ other key press detection technology to detect any changes associated with the fine or gross change in position or motion of a key 120. Example key press detection technologies include various capacitive, resistive, inductive, magnetic, force or pressure, linear or angular strain or displacement, temperature, aural, ultrasonic, optical, and other suitable techniques. With many of these technologies, one or more preset or variable thresholds may be defined for identifying presses and releases.

As a specific example, capacitive sensor electrodes may be disposed under the touchsurfaces, and detect changes in capacitance resulting from changes in press states of touchsurfaces. The capacitive sensor electrodes may utilize "self capacitance" (or "absolute capacitance") sensing methods based on changes in the capacitive coupling between the sensor electrodes and the touchsurface. In some embodiments, the touchsurface is conductive in part or in whole, or a conductive element is attached to the touchsurface, and held at a constant voltage such as system ground. A change in location of the touchsurface alters the electric field near the sensor electrodes below the touchsurface, thus changing the measured capacitive coupling. In one implementation, an absolute capacitance sensing method operates with a capacitive sensor electrode underlying a component having the touchsurface, modulates that sensor electrodes with respect to a reference voltage (e.g., system ground), and detects the capacitive coupling between that sensor electrode and the component having the touchsurface for gauging the press state of the touchsurface.

Some capacitive implementations utilize "mutual capacitance" (or "transcapacitance") sensing methods based on changes in the capacitive coupling between sensor electrodes. In various embodiments, the proximity of a touchsurface near the sensor electrodes alters the electric field between the sensor electrodes, thus changing the measured capacitive coupling. The touchsurface may be a conductive or non-conductive, electrically driven or floating, as long as its motion causes measurable change in the capacitive coupling between sensor electrodes. In some implementations, a transcapacitive sensing method operates by detecting the capacitive coupling between one or more transmitter sensor electrodes (also "transmitters") and one or more receiver sensor electrodes (also "receivers"). Transmitter sensor electrodes may be modulated relative to a reference voltage (e.g., system ground) to transmit transmitter signals. Receiver sensor electrodes may be held substantially constant relative to the reference voltage to facilitate receipt of resulting signals. A resulting signal may comprise effect(s) corresponding to one or more transmitter signals, and/or to one or more sources of environmental interference (e.g., other electromagnetic signals). Sensor electrodes may be dedicated transmitters or receivers, or may be configured to both transmit and receive.

In one implementation, a trans-capacitance sensing method operates with two capacitive sensor electrodes underlying a touchsurface, one transmitter and one receiver. The resulting signal received by the receiver is affected by the transmitter signal and the location of the touchsurface.

In some embodiments, the sensor system used to detect touchsurface presses may also detect pre-presses. For example, a capacitive sensor system may also be able to detect a user lightly touching a touchsurface, and distinguish that from the press of the touchsurface. Such a system can support multi-stage touchsurface input, which can respond differently to light touch and press.

Some embodiments are configured to gauge the amount of force being applied on the touchsurface from the effect that the force has on the sensor signals. That is, the amount of depression of the touchsurface is correlated with one or more particular sensor readings, such that the amount of press force can be determined from the sensor reading(s).

In some embodiments, substrates used for sensing are also used to provide backlighting associated with the touchsurfaces. As a specific example, in some embodiments utilizing capacitive sensors underlying the touchsurface, the capacitive sensor electrodes are disposed on a transparent or translucent circuit substrate such as polyethylene terephthalate (PET), another polymer, or glass. Some of those embodiments use the circuit substrate as part of a light guide system for backlighting symbols viewable through the touchsurfaces.

FIG. 1 also shows a section line A-A' relative to the key 122 of the keyboard 100, which will be discussed below.

The keyboard 100 may be integrated into or coupled to computer such as a laptop computer comprising one or more processing systems. The processing system(s) each comprise one or more ICs (integrated circuits) having appropriate processor-executable instructions for responding to key presses. These instructions direct the appropriate IC(s) to operate keyboard sensors to determine if a key has been pressed (or the extent of the press), and provide an indication of press status to a main CPU of the laptop or a response to the press status to a user of the laptop.

While the orientation terminology, vertical-lateral travel, sensing technology, and implementation options discussed here focuses on the keyboard 100, these discussions are readily analogized to other touchsurfaces and devices described herein.

Figure 2:
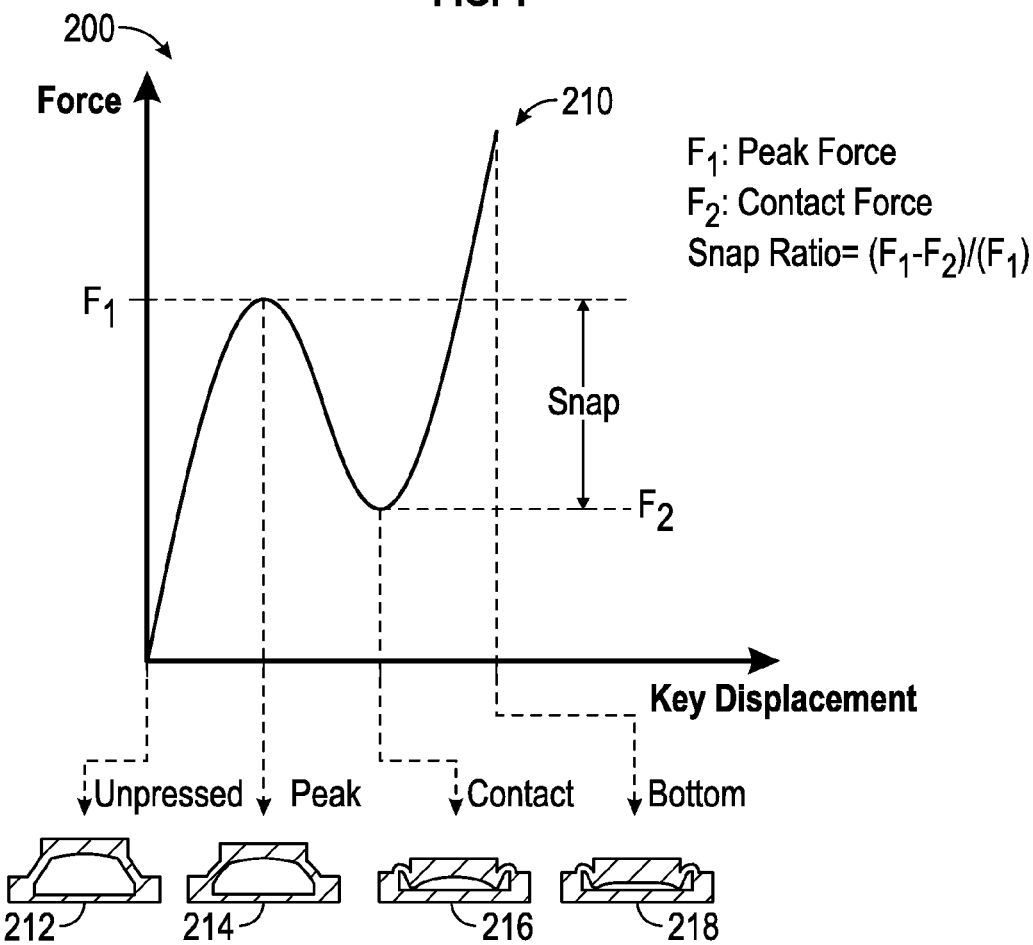
FIG. 2 is a graph of an example tactile response that is characteristic of many keys enabled with metal snap domes or rubber domes.

Various embodiments in accordance with the techniques described herein, including embodiments without metal snap domes or rubber domes, provide force response curves similar to the curve 210 of FIG. 2. Many tactile keyboard keys utilize snap ratios no less than 0.4 and no more than 0.6. Other tactile keyboard keys may use snap ratios outside of these ranges, such as no less than 0.3 and no more than 0.5, and no less than 0.5 and no more than 0.7.

Other embodiments provide other response curves having other shapes, including those with force and key travel relationships that are linear or nonlinear. Example nonlinear relationships include those which are piecewise linear, which contain linear and nonlinear sections, or which have constantly varying slopes. The force response curves may also be non-monotonic, monotonic, or strictly monotonic.

For example, the keys 120 made in accordance with the techniques described herein may be configured to provide the response shown by curve 210, or any appropriate response curve. The reaction force applied to a user may increase linearly or nonlinearly relative to an amount of total key travel, an amount of key travel the press direction, or an amount of key travel in a lateral direction. As a specific example, the force applied may increase with a constant slope relative to the amount of key travel for up to a first amount of force or key movement relative to its unpressed position, and then plateau (with constant force) or decrease for up to a second amount of force or key movement.

Figure 3A:
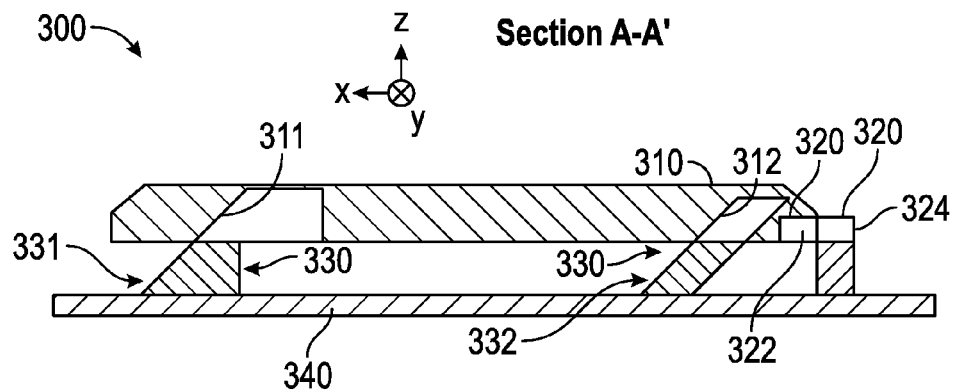
FIGS. 3A-3B are simplified side views of a first example touchsurface assembly configured in accordance with the techniques described herein.
Figure 3B:
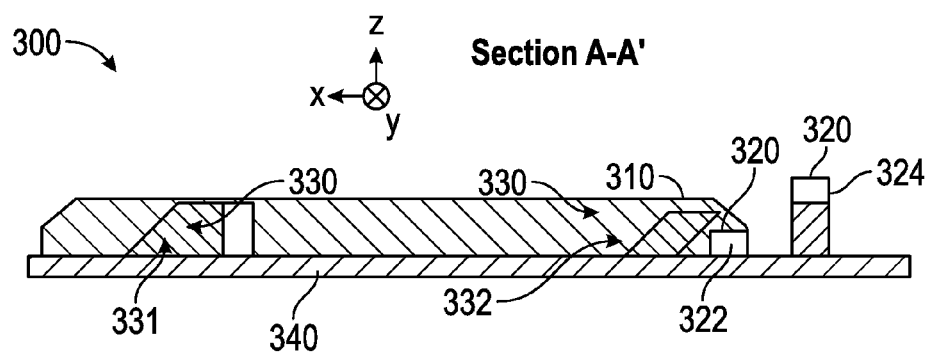

FIGS. 3A-3B are simplified cross-sectional views of a first example touchsurface assembly. The key assembly 300 may be used to implement various keys, including the key 122 of the keyboard 100. In the embodiment where FIGS. 3A-3B depict the key 122, these figures illustrate A-A' sectional views of the key 122. FIG. 3A shows the example key assembly 300 in an unpressed position and FIG. 3B shows the same key assembly 300 in a pressed position. The key assembly 300 may also be used in other devices utilizing keys, including keyboards other than the keyboard 100 and any other appropriate key-using device. Further, assemblies analogous to the key assembly 300 may be used to enable non-key touchsurface assemblies such as buttons, opaque touchpads, touchscreens, or any of the touchsurface assemblies described herein.

The key assembly 300 includes a keycap 310 that is visible to users and configured to be pressed by users, a ready/return mechanism 320, and a base 340. The unpressed and pressed positions of the keycap 310 are spaced in a press direction and in a first lateral direction orthogonal to the press direction. The press direction is analogous to the key motion found in conventional keyboards lacking lateral key motion, is in the negative-Z direction, and is the primary direction of press and key motion. In many keyboards the press direction is orthogonal to the touchsurface of the keycap or the base of the key, such that users would consider the press direction to be downwards toward the base.

The components of the key assembly 300 may be made from any appropriate material, including plastics such as polycarbonate (PC), acrylonitrile butadiene styrene (ABS), nylon, and acetal, metals such as steel and aluminum, elastomers such as rubber, and various other materials. In various embodiments, the keycap 310 is configured to be substantially rigid, such that the touchsurface of the keycap 310 appears to unaided human senses to move with rigid body motion between its unpressed and pressed positions during normal operation.

The ready/return mechanism 320 is a type of "biasing mechanism" that provides both readying and returning functions. The ready/return mechanism 320 physically biases the keycap 310 during at least part of the key press operation. It should be noted that a mechanism which only provides readying or returning function may also be termed a "biasing mechanism," if it biases the keycap 310 during at least part of the key press operation. The ready/return mechanism 320 is configured to hold the keycap 310 in its unpressed position so that the keycap 310 is ready to be pressed by a user. In addition, the ready/return mechanism 320 is also configured to return the keycap 310 partially or entirely to the unpressed position in response to a release of the press force to keycap 310. The release of the press force may be a removal of the press force, or a sufficient reduction of press force such that the key assembly is able to return the keycap 310 to the unpressed position as a matter of normal operation. In the example embodiment of FIG. 3, the key assembly 300 utilizes magnetically coupled components 322, 324 to form the ready/return mechanism 320. Magnetically coupled components 322, 324 may both comprise magnets, or one may comprise a magnet while the other comprise a magnetically coupled material such as a ferrous material. Although magnetically coupled components 322, 324 are each shown as a single rectangular shape, either or both magnetically coupled components 322, 324 may comprise non-rectangular cross-section(s) or comprise a plurality of magnetically coupled subcomponents having the same or different cross sections. For example, magnetically coupled component 322 or 324 may comprise a magnetic, box-shaped subcomponent disposed against a central portion of a ferrous, U-shaped subcomponent.

In some implementations, the magnetically coupled component 324 is physically attached to a bezel or base proximate to the keycap 310. The magnetically coupled component 322 is physically attached to the keycap and magnetically interacts with the magnetically coupled component 322. The physical attachment of the magnetically coupled components 322, 324 may be direct or indirect (indirectly being through one or more intermediate components), and may be accomplished by press fits, adhesives, or any other technique or combination of techniques. The amount of press force needed on the keycap to overcome the magnetic coupling (e.g., overpower the magnetic attraction or repulsion) can be customized based upon the size, type, shape, and positions of the magnetically coupling components 322, 324 involved.

The key assembly 300 comprises a planar-translation-effecting (PTE) mechanism 330 configured to impart planar translation to the keycap 310 when it moves between the unpressed and pressed positions, such that a nonzero component of lateral motion occurs. The PTE mechanism 330 is formed from parts of the keycap 310 and the base 340, and comprises four ramps (two ramps 331, 332 are visible in FIGS. 3A-B) disposed on the base 340. These four ramps are located such that they are proximate to the corners of the keycap 310 when the key assembly 300 is assembled. In the embodiment shown in FIGS. 3A-B, these four ramps (including ramps 331, 332) are simple, sloped planar ramps located at an angle to the base 340. These four ramps (including ramps 331, 332) are configured to physically contact corresponding ramp contacting features (two ramp contacting features 311, 312 are visible in FIGS. 3A-B) disposed on the underside of the keycap 310. The ramp contacting features of the keycap 310 may be any appropriate shape, including ramps matched to those of the ramps on the base 340.

In response to a press force applied to the touchsurface of the keycap 310 downwards along the press direction, the ramps on the base 340 (including ramps 331, 332) provide reaction forces. These reaction forces are normal to the ramps and include lateral components that cause the keycap 310 to exhibit lateral motion. The ramps and some retention or alignment features that mate with other features in the bezel or other appropriate component (not shown) help retain and level the keycap 310. That is, they keep the keycap 310 from separating from the ramps and in substantially the same orientation when travelling from the unpressed to the pressed position.

As shown by FIGS. 3A-B, the keycap 310 moves in the press direction (negative Z-direction) in response to a sufficiently large press force applied to the top of the keycap 310. As a result, the keycap 310 moves in a lateral direction (in the positive X-direction) and in the press direction (in the negative Z-direction) due to the reaction forces associated with the ramps. The ramp contacting features (e.g., 311, 312) of the keycap 310 ride on the ramps of the base 340 (e.g., 331, 332) as the keycap 310 moves from the unpressed to the pressed position. This motion of the keycap 310 moves the magnetically coupled components 322, 324 relative to each other, and changes their magnetic interactions.

FIG. 3B shows the keycap 310 in the pressed position. For the key assembly 300, the keycap 310 has moved to the pressed position when it directly or indirectly contacts the base 340 or has moved far enough to be sensed as a key press. FIGS. 3A-B do not illustrate the sensor(s) used to detect the press state of the keycap 310, and such sensor(s) may be based on any appropriate technology, as discussed above.

When the press force is released, the ready/return mechanism 320 returns the keycap 310 to its unpressed position. The attractive forces between the magnetically coupled components 322, 324 pull the keycap 310 back up the ramps (including the ramps 331, 322), toward the unpressed position.

Many embodiments using magnetic forces utilize permanent magnets. Example permanent magnets include, in order of strongest magnetic strength to the weakest: neodymium iron boron, samarium cobalt, alnico, and ceramic. Neodymium-based magnets are rare earth magnets, and are very strong magnets made from alloys of rare earth elements. Alternative implementations include other rare earth magnets, non-rare earth permanent magnets, and electromagnets.

Although the key assembly 300 utilizes magnetically coupled components to form its ready/return mechanism 320, various other techniques can be used instead or in addition to such magnetic techniques in other embodiments. In addition, separate mechanisms may be used to accomplish the readying and returning functions separately. For example, one or more mechanisms may retain the keycap in its ready position and one or more other mechanisms may return the keycap to its ready position. Examples of other readying, returning, or ready/return mechanisms include buckling elastomeric structures, snapping metallic domes, deflecting plastic or metal springs, stretching elastic bands, bending cantilever beams, and the like. In addition, in some embodiments, the ready/return mechanism push (instead of pull) the keycap 310 to resist keycap motion to the pressed position or to return it to the unpressed position. Such embodiments may use magnetic repulsion or any other appropriate technique imparting push forces.

Many variations of or additions to the components of the key assembly 300 are possible. For example, other embodiments may include fewer or more components. As a specific example, another key assembly may incorporate any number of additional aesthetic or functional components. Some embodiments include bezels that provide functions such as hiding some of the key assembly from view, protecting the other components of the key assembly, helping to retain or guide the touchsurface of the key assembly, or some other function.

As another example, other embodiments may comprise different keycaps, readying mechanisms, returning mechanisms, PTE mechanisms, leveling mechanisms, or bases. As a specific example, the keycap 310, the base 340, or another component that is not shown may comprise protrusions, depressions, or other features that help guide or retain the keycap 310. As another specific example, some embodiments use non-ramp techniques in place or (or in addition to) ramps to effect planar translation. Examples other PTE mechanisms include various linkage systems, cams, pegs and slots, bearing surfaces, and other motion alignment features.

As yet another example, although the PTE mechanism 330 is shown in FIGS. 3A-B as having ramps disposed on the base 340 and ramp contacting features disposed on the keycap 310, other embodiments may have one or more ramps disposed on the keycap 310 and ramp contacting features disposed on the base 340. Also, the PTE mechanism 330 is shown in FIGS. 3A-B as having ramps 331, 332 with simple, sloped plane ramp profiles. However, in various embodiments, the PTE mechanism 330 may utilize other profiles, including those with linear, piecewise linear, or nonlinear sections, those having simple or complex curves or surfaces, or those including various convex and concave features. Similarly, the ramp contacting features on the keycap 310 may be simple or complex, and may comprise linear, piecewise linear, or non-linear sections. As some specific examples, the ramp contacting features may comprise simple ramps, parts of spheres, sections of cylinders, and the like. Further, the ramp contacting features on the keycap 310 may make point, line, or surface contact the ramps on the base 340 (including ramps 331, 332). "Ramp profile" is used herein to indicate the contour of the surfaces of any ramps used for the PTE mechanisms. In some embodiments, a single keyboard may employ a plurality of different ramp profiles in order to provide different tactile responses for different keys.

As a further example, embodiments which level their touchsurfaces may use various leveling techniques which use none, part, or all of the associate PTE mechanism.

Figure 4:
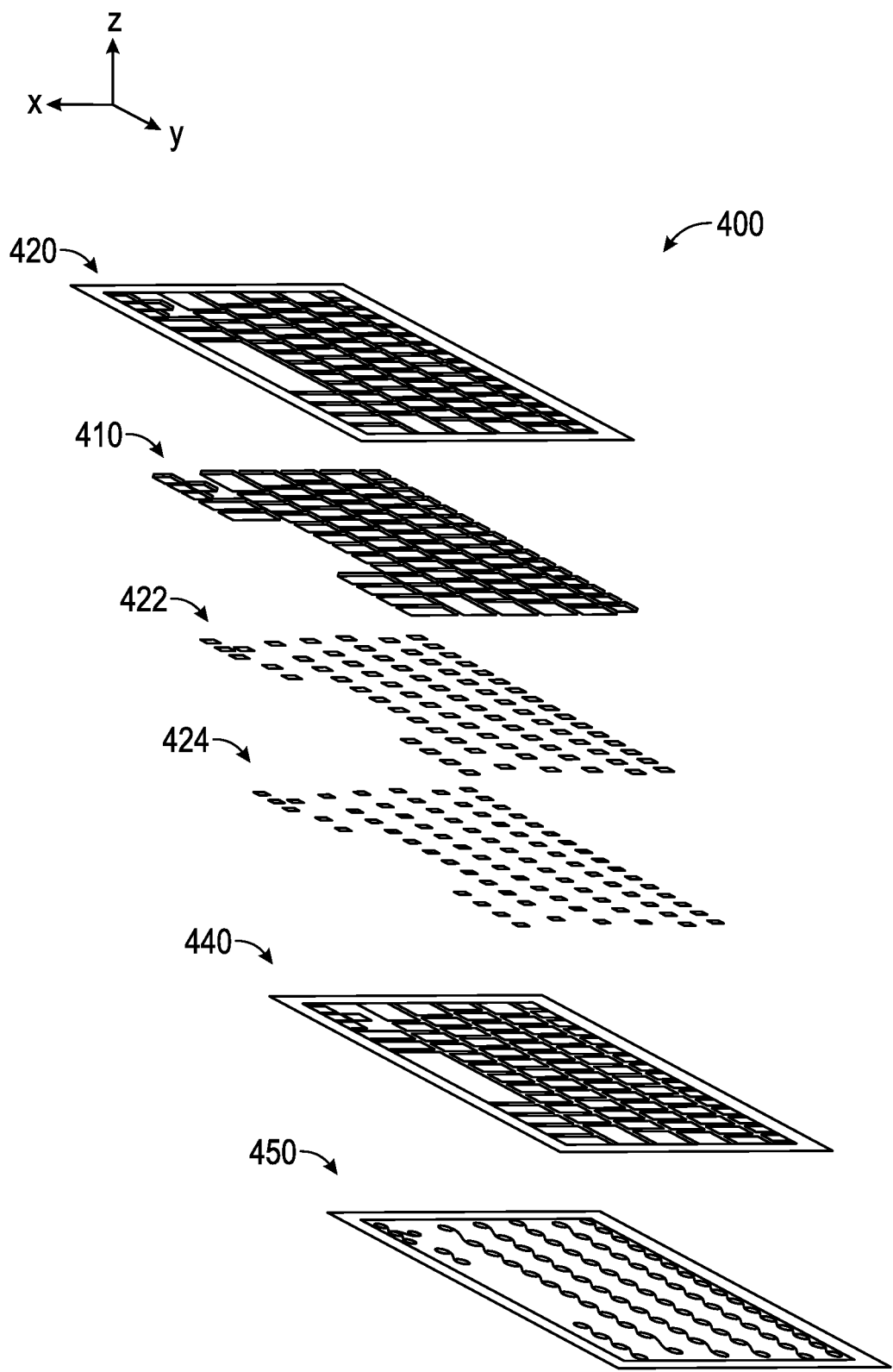
FIG. 4 shows an exploded view of an example keyboard in accordance with the techniques described herein

FIG. 4 shows an exploded view of an example keyboard construction 400 in accordance with the techniques described herein. A construction like the keyboard construction 400 may be used to implement any number of different keyboards, including keyboard 100. Proceeding from the top to the bottom of the keyboard, the bezel 420 comprises a plurality of apertures through which keycaps 410 of various sizes are accessible in the final assembly. Magnetically coupled components 422, 424 are attached to the keycaps 410 or the base 440, respectively. The base 440 comprises a plurality of PTE mechanisms (illustrated as simple rectangles on the base 440) configured to guide the motion of the keycaps 410. Underneath the base 440 is a key sensor 450, which comprises one or more layers of circuitry disposed on one or more substrates.

Various details have been simplified for ease of understanding. For example, adhesives that may be used to bond components together are not shown. Also, various embodiments may have more or fewer components than shown in keyboard construction 400, or the components may be in a different order. For example, the base and the key sensor 450 may be combined into one component, or swapped in the stack-up order.

Figure 5:
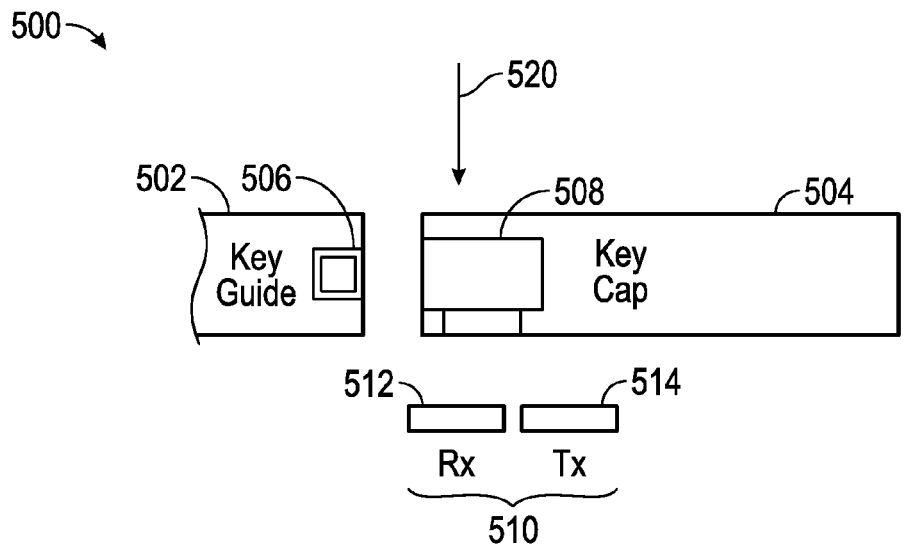
FIG. 5 is a schematic layout diagram of an exemplary key assembly including a stationary key guide having a key guide magnet, a movable key cap having a key cap magnet, and a keystroke sensor underlying the key cap in accordance with the techniques described herein.

Referring now to FIG. 5, an exemplary key assembly 500 includes a stationary key guide 502 having a key guide magnet 506, a movable key cap 504 having a key cap magnet 508, and a keystroke sensor 510 including a transmitter electrode 514 and a receiver electrode 512 underlying the key cap 504. One or both of the magnets 506, 508 may be made from a ferromagnetic material or a permanent magnet. As described above, a user applies force generally along the direction of arrow 520 to the top of the key cap 504, resulting in a downward keystroke. When the user removes the applied force, the magnetic attraction between the magnets 506, 508 restores the key cap to the nominal position shown in FIG. 5.

Figure 6:
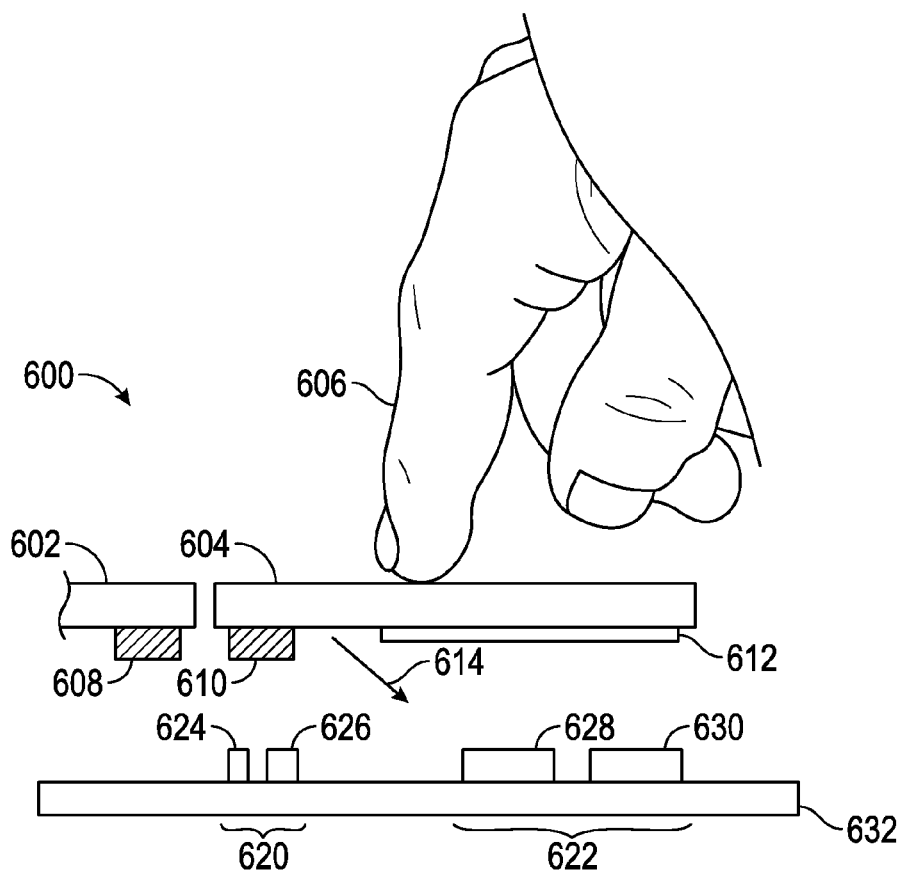
FIG. 6 is a schematic layout diagram of an exemplary key assembly including a stationary key guide having a key guide magnet, a movable key cap having a key cap magnet, a keystroke sensor, a finger presence sensor, and a conductive portion configured to capacitively interact with the finger presence sensor in accordance with the techniques described herein.

FIG. 6 is an exemplary key assembly 600 including a stationary key guide 602 and a movable key cap 604 configured to be pressed downwardly generally along an arrow 614 by an input object 606 (e.g., a finger). The key assembly 600 includes a finger presence sensor 622 and a keystroke sensor 620 mounted to a floor 632 underneath the key assembly. The finger presence sensor 622 may be in the form of an electrode pair including a transmitter electrode 624 and a receiver electrode 626. Similarly, the keystroke sensor 620 may be in the form of an electrode pair including a transmitter electrode 628 and a receiver electrode 630.

The key cap 604 includes a magnet 610 and a conductive portion 612. The key guide 602 includes a magnet 508. The magnets 608 and 610 cooperate magnetically to provide tactile feedback to the user when pressing on the key cap 604, in the form of an initial resistance to be overcome by the input object 606 during a keystroke. The magnets 608 and 610 may also interact magnetically to provide a restoring force which returns the key cap 604 to the nominal position shown in FIG. 6 following a keystroke.

The keystroke sensor 620 capacitively interacts with the magnet 610, and the finger presence sensor 622 capacitively interacts with the conductive portion 612 during a key stroke, which together facilitate the detection of both keystroke position information and information relating to the presence of a finger on the key cap surface. By using a two piece construction for the key cap and key base, one or both of the key cap magnet and conductive portion may be sandwiched, wedged, or otherwise contained or secured within either or both pieces, as described in greater detail below in conjunction with FIGS. 7-9.

Figure 7:
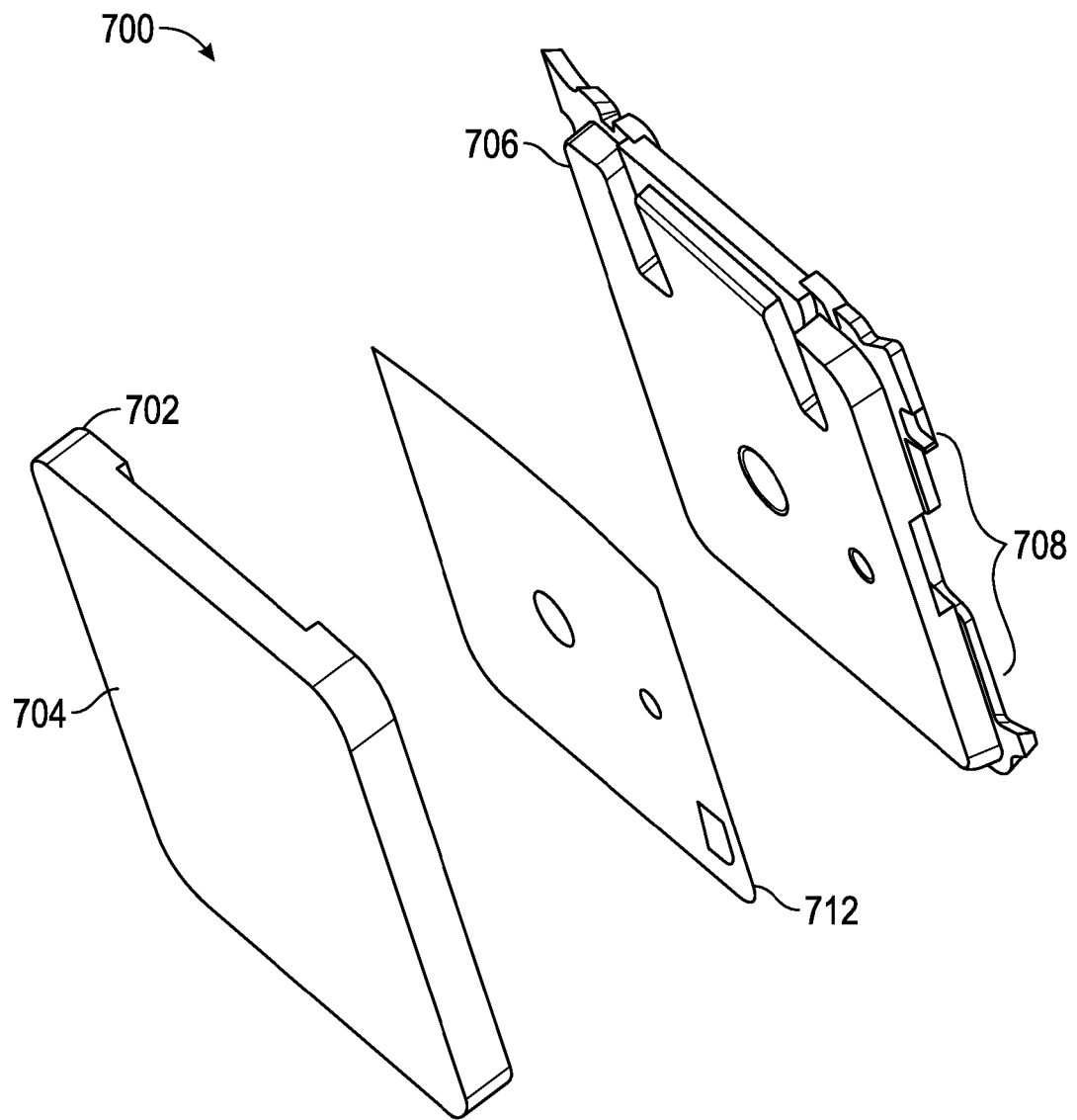
FIG. 7 is an exploded view of an exemplary two part key assembly including a key cap having a top surface, a key base including a PTE mating feature (ramp), and a conductive component disposed between the key cap and the key base in accordance with the techniques described herein.

FIG. 7 is an exploded view of an exemplary two part key assembly 700 including a key cap 702 having a top surface 704, a key base 706 including a PTE mating feature 708 such as one or more ramps, and a conductive component 712 disposed between the key cap and the key base.

Figure 8:
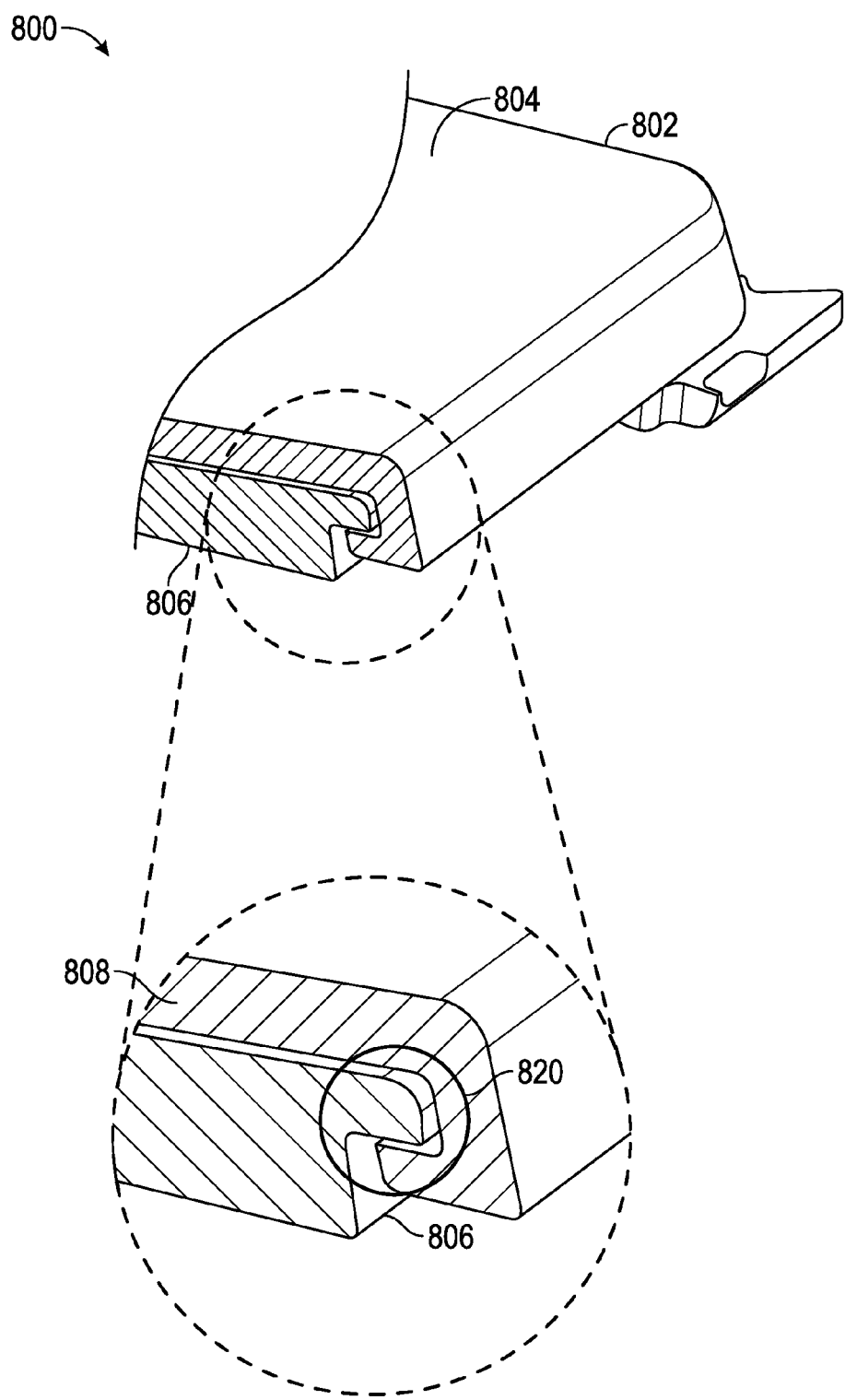
FIG. 8 is an isometric view of an exemplary key assembly showing the key cap connected to the key base with the conductive layer sandwiched therebetween in accordance with the techniques described herein.

FIG. 8 is an isometric view of an exemplary key assembly 800 including a key cap 802 having a top surface 804, and a key base 806 (the PTE mating features are omitted from FIG. 8 for clarity). As shown, the key cap 802 may connected to the key base 806 with the conductive layer 808 sandwiched therebetween. Specifically, the key base 806 may be snap fit or otherwise mechanically coupled to the key cap 802 via a mechanical junction 820.

Figure 9:
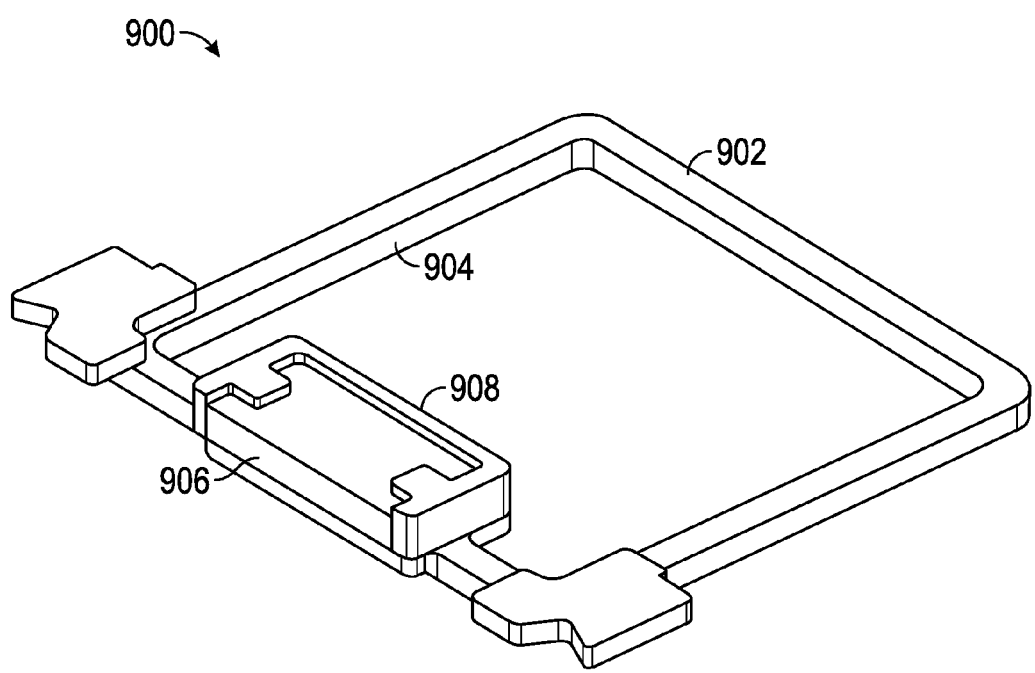
FIG. 9 is an isometric view of an exemplary key base having a magnet at least partially secured thereto in accordance with the techniques described herein.

Referring now to FIG. 9, an exemplary key base 902 includes a PTE mating feature 904 and a basket 908 for partially or completely securing a magnet 906 to or within the key base 902.

Those skilled in the art will appreciate that the two piece key assembly embodiments disclosed herein permit both a magnet and a conductive portion to be secured to and/or within the key assemble in a manner which electrically isolates the magnet from the conductive portion, thereby avoiding cross talk between them.

It will also be appreciated that the use of a two piece construction allows the key caps to be swapped out after installation, for example, to convert the keyboard from one language to another.

A keyboard is thus provided which includes a plurality of key assemblies and planar translation effecting (PTE) features. In an embodiment, each of at least a subset of the key assemblies includes: a key base including a PTE mating feature; and a key cap having a top surface component configured to be contacted by an input object; wherein the PTE mating feature is configured such that the key cap translates vertically and laterally in a planar manner relative to the PTE feature in response to the input object contact. The PTE mating feature may be made form a first material and the top surface component may be made from a second material which is different from the first material, wherein first material is characterized by a relatively higher lubricity and/or coefficient of sliding friction than the second material.

In an embodiment, the key base and key cap are configured to be mechanically coupled together, for example, using a snap fit or an interference fit attachment.

In another embodiment, the PTE mating feature comprises a ramp.

In an embodiment, the key assemblies are configured to cooperate with respective key guides including a first magnetic component, and each key assembly comprises a second magnetic component configured to magnetically cooperate with the first magnetic component to return the key assembly to a nominal position following a keystroke.

In an embodiment, the second magnetic component is substantially retained within the key cap.

In an embodiment, the second magnetic component is substantially retained between the top surface component and the key base.

In an embodiment, the top surface component comprises identifying indicia.

In an embodiment, the PTE mating feature comprises Teflon, PTFE, or any suitable material which facilitates sliding engagement with the PTE feature.

In an embodiment, the keyboard also includes a backlight configured to illuminate the top surface components from underneath, wherein each top surface component further comprises a substantially opaque layer outlining a unique identifying indicia. The substantially opaque layer may be applied to the top surface component by at least one of painting and printing.

In an embodiment, the key assembly also includes a conductive layer disposed between the top surface component and the key base.

In an embodiment, the keyboard further includes: a first plurality of capacitive sensor electrodes disposed underneath the key assemblies, each of the first plurality of capacitive sensor electrodes being configured to detect motion of a respective key assembly in response to downward force applied by the input object; and a second plurality of capacitive sensor electrodes disposed underneath at least a subset of the key assemblies, each of the second plurality of capacitive sensor electrodes being configured to detect positional information about the input object interacting with a respective key.

In an embodiment, each conductive layer of each subset of key assemblies is configured to capacitively couple with a respective one of the second plurality of capacitive sensor electrodes.

In an embodiment, the key base is substantially translucent.

A key assembly is also provided for use in a keyboard of the type including a key guide having a planar translation effecting (PTE) feature. The assembly includes: a key base having a PTE mating feature configured to interact with the PTE feature during a key press, the key base made of a first material; and a key cap configured to be attached to the key base and made of a second material different from the first material.

A method is provided for assembling a keyboard having a plurality of key assemblies, each configured to cooperate with a respective key guide having a planar translation effecting (PTE) feature. The method includes: inserting a key base including a PTE mating feature into the PTE feature of the key guide; and attaching a key cap, having a top surface configured to be contacted by an input object, to the key base.

Thus, the techniques described herein can be used to implement any number of devices utilizing different touchsurface assemblies, including a variety of keyboards each comprising one or more key assemblies in accordance with the techniques described herein. Some components may be shared when multiple touchsurfaces are placed in the same device. For example, the base may be shared by two or more touchsurfaces. As another example, the keyswitch sensor may be shared through sharing sensor substrates, sensor electrodes, or the like.

The implementations described herein are meant as examples, and many variations are possible. As one example, any appropriate feature described with one implementation may be incorporated with another. As a first specific example, any of the implementations described herein may or may not utilize a finishing tactile, aesthetic, or protective layer. As a second specific example, ferrous material may be used to replace magnets in various magnetically coupled component arrangements.

In addition, the structure providing any function may comprise any number of appropriate components. For example, a same component may provide leveling, planar translation effecting, readying, and returning functions for a key press. As another example, different components may be provide these functions, such that a first component levels, a second component effects planar translation, a third component readies, and a fourth component returns. As yet another example, two or more components may provide a same function. For example, in some embodiments, magnets and springs together provide the return function, or the ready and return functions. Thus, the techniques described in the various implementations herein may be used in conjunction with each other, even where the function may seem redundant. For example, some embodiments use springs to back-up or augment magnetically-based ready/return mechanisms.

What is claimed is:

1. A keyboard having a plurality of key assemblies and planar translation effecting (PTE) features, wherein each of at least a subset of the key assemblies comprises:
   a key base including a PTE mating feature; and
   a key cap having a top surface component configured to be contacted by an input object;
   wherein the PTE mating feature is configured such that the key cap translates vertically and laterally in a planar manner relative to the PTE feature in response to the input object contact,
   wherein the PTE mating feature comprises a first material and the top surface component comprises a second material different from the first material, and
   wherein the first material is characterized by a relatively higher coefficient of sliding friction than the second material.

2. The keyboard of claim 1, wherein the first material is characterized by a relatively higher lubricity than the second material.

3. The keyboard of claim 1, wherein the key base and key cap are configured to be mechanically coupled together.

4. The keyboard of claim 3, wherein mechanically coupled comprises at least one of a snap fit and an interference fit attachment.

5. The keyboard of claim 1, wherein the PTE mating feature comprises a ramp.

6. The keyboard of claim 1, wherein each of the subset of the key assemblies is configured to cooperate with a respective key guide including a first magnetic component, and further wherein the key assembly comprises a second magnetic component configured to magnetically cooperate with the first magnetic component to return the key assembly to a nominal position following a keystroke.

7. The keyboard of claim 6, wherein the second magnetic component is substantially retained within the key cap.

8. The keyboard of claim 6, wherein the second magnetic component is substantially retained between the top surface component and the key base.

9. The keyboard of claim 1, wherein the top surface component comprises identifying indicia.

10. The keyboard of claim 1, wherein the PTE mating feature comprises polytetrafluoroethylene.

11. The keyboard of claim 1, further comprising a backlight configured to illuminate the top surface components from underneath, wherein each top surface component further comprises a substantially opaque layer outlining a unique identifying indicia.

12. The keyboard of claim 11, wherein the substantially opaque layer is applied to the top surface component by at least one of painting and printing.

13. The keyboard of claim 1, wherein the key assembly further comprises a conductive layer disposed between the top surface component and the key base.

14. The keyboard of claim 13, further comprising:
   a first plurality of capacitive sensor electrodes disposed underneath the key assemblies, each of the first plurality of capacitive sensor electrodes being configured to detect motion of a respective key assembly in response to downward force applied by the input object; and
   a second plurality of capacitive sensor electrodes disposed underneath at least a subset of the key assemblies, each of the second plurality of capacitive sensor electrodes being configured to detect positional information about the input object interacting with a respective key.

15. The keyboard of claim 14, wherein each conductive layer of each subset of key assemblies is configured to capacitively couple with a respective one of the second plurality of capacitive sensor electrodes.

16. The keyboard of claim 1, wherein the key base is substantially translucent.

17. A key assembly for use in a keyboard of the type including a key guide having a planar translation effecting (PTE) feature, the assembly comprising:
   a key base having a PTE mating feature configured to interact with the PTE feature during a key press, the key base made of a first material; and
   a key cap configured to be attached to the key base and made of a second material different from the first material,
   wherein the PTE mating feature comprises a first material and the top surface component comprises a second material different from the first material, and
   wherein the first material is characterized by a relatively higher coefficient of sliding friction than the second material.

18. A method of assembling a keyboard having a plurality of key assemblies each configured to cooperate with a respective key guide having a planar translation effecting (PTE) feature, the method comprising:
   inserting a key base including a PTE mating feature into the PTE feature of the key guide; and
   attaching a key cap, having a top surface configured to be contacted by an input object, to the key base,
   wherein the PTE mating feature comprises a first material and the top surface component comprises a second material different from the first material, and
   wherein the first material is characterized by a relatively higher coefficient of sliding friction than the second material.

* * * * *